US011133299B2

(12) United States Patent
Lai et al.

(10) Patent No.: US 11,133,299 B2
(45) Date of Patent: Sep. 28, 2021

(54) GATE-LIFTED NMOS ESD PROTECTION DEVICE

(71) Applicant: NXP B.V., Eindhoven (NL)

(72) Inventors: Da-Wei Lai, Nijmegen (NL); Stephen John Sque, Veldhoven (NL); Wilhelmus Cornelis Maria Peters, Groesbeek (NL)

(73) Assignee: NXP B.V., Eindhoven (NL)

( * ) Notice: Subject to any disclaimer, the term of this patent is extended or adjusted under 35 U.S.C. 154(b) by 188 days.

(21) Appl. No.: 16/152,142

(22) Filed: Oct. 4, 2018

(65) Prior Publication Data

US 2020/0111778 A1  Apr. 9, 2020

(51) Int. Cl.
*H01L 27/02* (2006.01)
*H01L 27/06* (2006.01)
*H02H 9/04* (2006.01)
H01L 29/861 (2006.01)
H01L 29/08 (2006.01)
H01L 29/06 (2006.01)
H01L 29/10 (2006.01)
H01L 29/735 (2006.01)

(52) U.S. Cl.
CPC ...... *H01L 27/0266* (2013.01); *H01L 27/0635* (2013.01); *H02H 9/046* (2013.01); *H01L 29/0649* (2013.01); *H01L 29/0808* (2013.01); *H01L 29/0821* (2013.01); *H01L 29/0847* (2013.01); *H01L 29/1008* (2013.01); *H01L 29/735* (2013.01); *H01L 29/861* (2013.01)

(58) Field of Classification Search
CPC . H01L 27/0266; H01L 27/0635; H01L 29/87; H01L 29/1008; H01L 29/0847; H01L 29/0808; H01L 29/0649; H01L 29/861; H01L 29/735; H01L 29/0821; H01L 27/0248; H01L 29/7869; H02H 9/046; H02H 7/003
See application file for complete search history.

(56) References Cited

U.S. PATENT DOCUMENTS

| 6,501,632 B1* | 12/2002 | Avery | H01L 27/0277 361/111 |
|---|---|---|---|
| 7,777,999 B2* | 8/2010 | Kang | H01L 29/7436 257/173 |
| 9,882,375 B2* | 1/2018 | Van Wijmeersch | H01L 27/0262 |
| 2004/0201033 A1* | 10/2004 | Russ | H01L 29/87 257/107 |

(Continued)

OTHER PUBLICATIONS

Chiang, Chun et al, "Low-Trigger ESD Protection Design with Latch-Up Immunity for 5-V CMOS Application by Drain Engineering", IEEE 24th Inter'l Symposium on the Physical and Failure Analysis of Integrated Circuits (IPFA), pp. 1-3. (2017).

(Continued)

*Primary Examiner* — Gustavo A Rosario-Benitez

(57) ABSTRACT

An ESD protection device including a PNP transistor connected to an input pad, a diode connected to the PNP transistor and connected to an output pad, and an NMOS transistor connected to the PNP transistor and the output pad, wherein the diode, PNP transistor, and NMOS transistor are configured to route different levels of an electrostatic discharge (ESD) current pulse from the input pad to the output pad.

19 Claims, 9 Drawing Sheets

(56) References Cited

U.S. PATENT DOCUMENTS

| | | | | |
|---|---|---|---|---|
| 2007/0069310 | A1* | 3/2007 | Song | H01L 27/0262 257/409 |
| 2009/0161273 | A1* | 6/2009 | Li | H02H 9/046 361/56 |
| 2010/0109076 | A1* | 5/2010 | Wang | H01L 27/0262 257/328 |
| 2012/0099229 | A1* | 4/2012 | Domanski | H01L 27/0262 361/56 |
| 2012/0120531 | A1* | 5/2012 | Abou-Khalil | H02H 9/046 361/56 |
| 2012/0161216 | A1* | 6/2012 | Liang | H01L 27/0285 257/296 |
| 2012/0176707 | A1* | 7/2012 | Vashchenko | H02H 9/046 361/56 |
| 2012/0250194 | A1* | 10/2012 | Gallerano | H01L 27/0262 361/56 |
| 2014/0355157 | A1* | 12/2014 | Huang | H02H 9/046 361/56 |
| 2018/0247927 | A1* | 8/2018 | Lai | H02H 9/04 |
| 2018/0331090 | A1* | 11/2018 | de Raad | H02H 9/046 |

OTHER PUBLICATIONS

Duvvury, C. et al., "Dynamic Gate Coupling of NMOS for Efficient Output ESD Protection", IEEE 30th Annual Proceedings of International Reliability Physics Symposium, 10 pages, (1992).

Duvvury, C. et al., "Reliability design of p/sup +/− pocket implant LDD transistors", International Technical Digest on Electron Devices, pp. 215-218. (1990).

Hsu, S.F. et al., "A Novel 8kV On-Chip Surge Protection Design in xDSL Line Driver IC". IEEE International Reliability Physics Symposium, pp. 3F4.1-3F.4.4. (2015).

Jiang, C. et al., "Optimization of Boron Pocket Implantation for Deep Sub-micron NMOSFET Process", Proceedings of the IEEE 4th Int'l Conference on Solid-State and IC Technology, pp. 224-226. (1995).

Ker, M.D, et al., "ESD Implantations for On-Chip ESD Protection With Layout Consideration in 0.18-um Salicided CMOS Technology", IEEE Transactions on Semiconductor Manufacturing, vol. 18, No. 2, 10 pages. (May 2005).

Ker, M.D. et al, "ESD Protection for Deep-Submicron CMOS Technology Using Gate-Couple CMOS-Trigger Lateral SCR Structure", Proceedings of IEEE Custom Integrated Circuits Conference, pp. 31-24, (1997).

Ker, M. D. "Whole-Chip ESD Protection Design with Efficient VDD-to-VSS ESD Clamp Circuits for Submicron CMOS VLSI", IEEE Transactions on Electron Devices, vol. 46, No, 1, 11 pages. (Jan. 1999).

Kim, D. J. et al., "Area-Efficient Power Clamp Circuit Using gate-coupled structure for Smart Power ICs", IEEE International SoC Design Conference, vol. 01, pp. I-429-I-430. (2008).

Morishita, Y., "New ESD Protection Circuits based on PNP Triggering SCR for Advanced CMOS Device Applications", IEEE Electrical Overstress/Electrostatic Discharge Symposium, pp. 6-9. (2002).

Sharma, U. et al; "An ESD Protection Scheme for Deep Sub-micron ULSI Circuits", Symposium on VLSI Technology, Digest of Technical Papers, pp. 85-86. (1995).

Tsai, M, F. et al., "An On-chip Combo Clamp for Surge and Universal ESD Protection in Bulk FinFET Technology", 38th Electrical Overstress/Electrostatic Discharge Symposium, pp. 1-7, (2016).

Vashchenko, V.A. et al., "ESD-Implant Effect on Protection Capability of NMOS Structures", IEEE 33rd Conference on European Solid-State Device Research, pp. 565-568, (2003).

Worley, E.R. et al., "Sub-Micron Chip ESD Protection Schemes Which Avoid Avalanching Junctions", Electrical Overstress/Electrostatic Discharge Symposium Proceedings, pp. 13-20. (1995).

Boselli, G. et al., "Drain Extended nMOS High Current Behavior and ESD Protection Strategy for HV Applications in Sub-100nm CMOS Technologies", IEEE 45th Annual International Reliability Physics Symposium, Phoenix, AZ, USA 6 pages. (2007).

Farbiz, F. et al., "Novel Techniques to Modulate the Holding Voltage in High Voltage ESD Protections". 7 pages.

Lai, D. W. et al., "PNP-eSCR ESD Protection Device with Tunable Trigger and Holidng Voltage for High Voltage Applications", IEEE 38th Electrical Overstress/Electrostatic Discharge Symposium, Garden Grove, CA, USA, Sep. 11-16, 2016, 8 pages. (Oct. 18, 2016).

Mergens, M.P.J. et al., "High Holding Current SCRs (HHI-SCR) for ESD Protection and Latch-up Immune IC Operation", Sarnoff Corporation and ESD Association, pp. 10-17. (2002).

Okushima, M., "ESD Protection Design for Mixed-Power Domains in 90nm CMOS with New Efficient Power Clamp and GND Current Trigger (GCT) Technique", IEEE Electrical Overstress/Electrostatic Discharge Symposium, Anaheim, CA, USA, 9 pages. (Sep. 2006).

Shrivastava, M. "A Review on the ESD Robustness of Drain-Extended MOS Devices", IEEE Transaction on Dev. and Mat. Reliability, V. 12, No. 4, pp. 615-625. (2012).

Ker, M. "Layout Design on Multi-Finger Mosfet for On-Chip ESD Protection Circuits in a 0.18um Salicided CMOS Process", IEEE, pp. 361-364. (2001).

\* cited by examiner

GATE-LIFTED NMOS ESD PROTECTION DEVICE

TECHNICAL FIELD

Various exemplary embodiments disclosed herein relate to electrostatic discharge (ESD) protection, and more particularly to a gate-lifted NMOS ESD protection device triggered by a PNP in series with a diode.

BACKGROUND

Traditionally, grounded-gate NMOS (GGNMOS) devices are used as local protection for fail-safe and open-drain applications. However, a trigger voltage (VT1) of both the GGNMOS and a device to be protected (victim) are often near identical. In practice, a gate of the victim is floating during ESD stress, and the fail voltage of the victim is lower when the gate node is lifted with respect to the grounded-gate condition. Therefore, the GGNMOS is incapable of protecting the victim. Drain-engineered (with heavily P-doped or ESD-implant layers) and Zener-diode-triggered devices have been demonstrated, using additional process options. Gate-coupled, gate-driven, or PNP-triggered solutions have been demonstrated for VT1 reduction, with additional circuitry. In practice, these approaches are only useful for supply protection, because fast signals may cause false triggering.

SUMMARY

A brief summary of various embodiments is presented below. Some simplifications and omissions may be made in the following summary, which is intended to highlight and introduce some aspects of the various embodiments, but not to limit the scope of the invention. Detailed descriptions of embodiments adequate to allow those of ordinary skill in the art to make and use the inventive concepts will follow in later sections.

Embodiments include an electrostatic discharge (ESD) protection device including a PNP transistor connected to an input pad, a diode connected to the PNP transistor and connected to an output pad, and an NMOS transistor connected to the PNP transistor and the output pad, wherein the diode, PNP transistor, and NMOS transistor are configured to route different levels of an electrostatic discharge (ESD) current pulse from the input pad to the output pad.

The ESD protection device may be triggered by the PNP in series with the diode. A trigger mechanism of the ESD protection device may be a floating base region of the PNP transistor in series with the diode. The NMOS transistor may be in an initial off state because of the floating base region of the PNP transistor.

The diode and the PNP transistor may combine to form a low current path for the ESD current.

The PNP transistor and the NMOS transistor may combine to form a medium current path for the ESD current.

The NMOS transistor and the PNP transistor may combine to form an embedded SCR configured to route a high current path for the ESD current.

The gate of the NMOS transistor may be connected to the collector of the PNP transistor and to the anode of the diode.

An emitter of the PNP transistor may be connected to the input pad.

ESD current may be conducted via a channel of the NMOS transistor and a parasitic parallel NPN transistor of the gate-lifted NMOS and boosted at higher current levels via embedded SCR action.

The ESD protection device may include a first isolation region disposed between the diode and the PNP transistor and a second isolation region disposed between the PNP transistor and the NMOS transistor.

The first highly doped isolation region may be wider than the second highly doped isolation region.

The PNP transistor may have emitter and collector contact regions having a same conductivity type as the first isolation region and the second isolation region.

Embodiments may also include a method of operating an electrostatic discharge (ESD) protection device, including receiving a low energy current portion of an ESD pulse at an PNP transistor, conducting the low energy current portion of the ESD pulse to an output pad through a diode, receiving a medium energy current portion of the ESD pulse at the PNP transistor, conducting the medium energy current portion of the ESD pulse to the output pad through an NMOS transistor, receiving a high energy current portion of an ESD pulse at the PNP transistor and conducting the high energy current portion of the ESD pulse to the output pad through a silicon controlled rectifier (SCR) formed from the PNP transistor and the NMOS transistor.

The method may include triggering the ESD protection device using the PNP transistor in series with the diode.

BRIEF DESCRIPTION OF THE DRAWINGS

Additional objects and features of the invention will be more readily apparent from the following detailed description and appended claims when taken in conjunction with the drawings. Although several embodiments are illustrated and described, like reference numerals identify like parts in each of the figures, in which:

DETAILED DESCRIPTION

Figure 1:
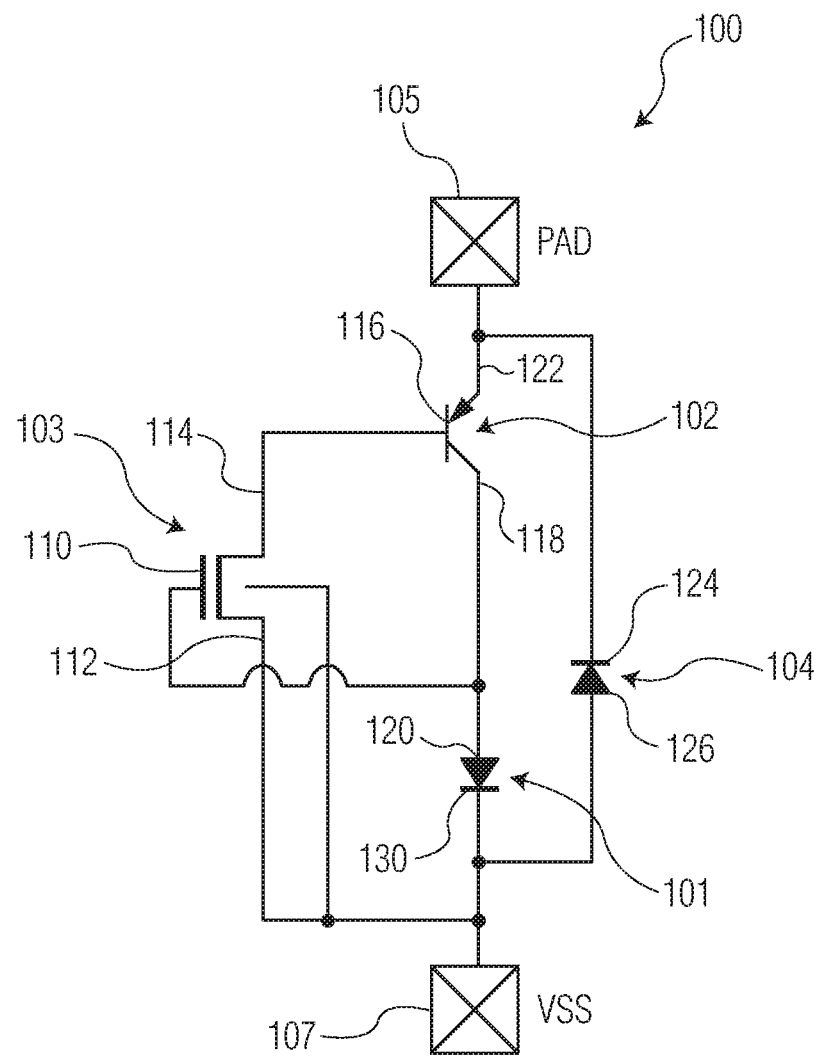
FIG. 1 illustrates a circuit diagram of an ESD protection device in accordance with embodiments described herein.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or illustrated herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various embodiments described herein are not necessarily mutually exclusive, as some embodiments can be combined with one or more other embodiments to form new embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

Embodiments described herein include a voltage-triggered ESD device that is based on PNP, diode, and GGNMOS components. By connecting a gate of an NMOS to the anode of the diode, a gate-lifted NMOS is formed and triggered by a floating-base PNP transistor in series with the diode.

Figure 2:
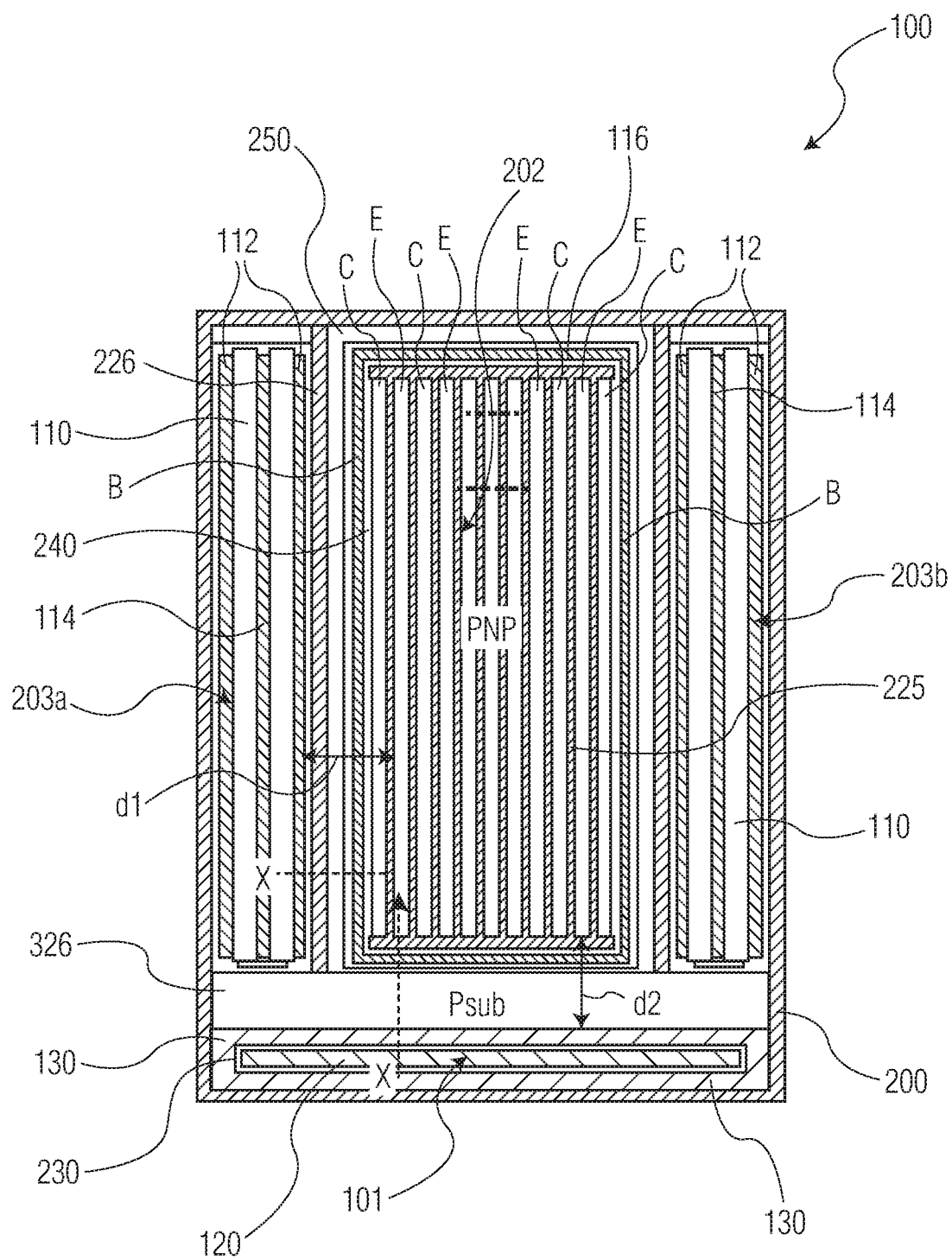
FIG. 2 illustrates a layout design of an ESD protection device in accordance with FIG. 1.
Figure 3:
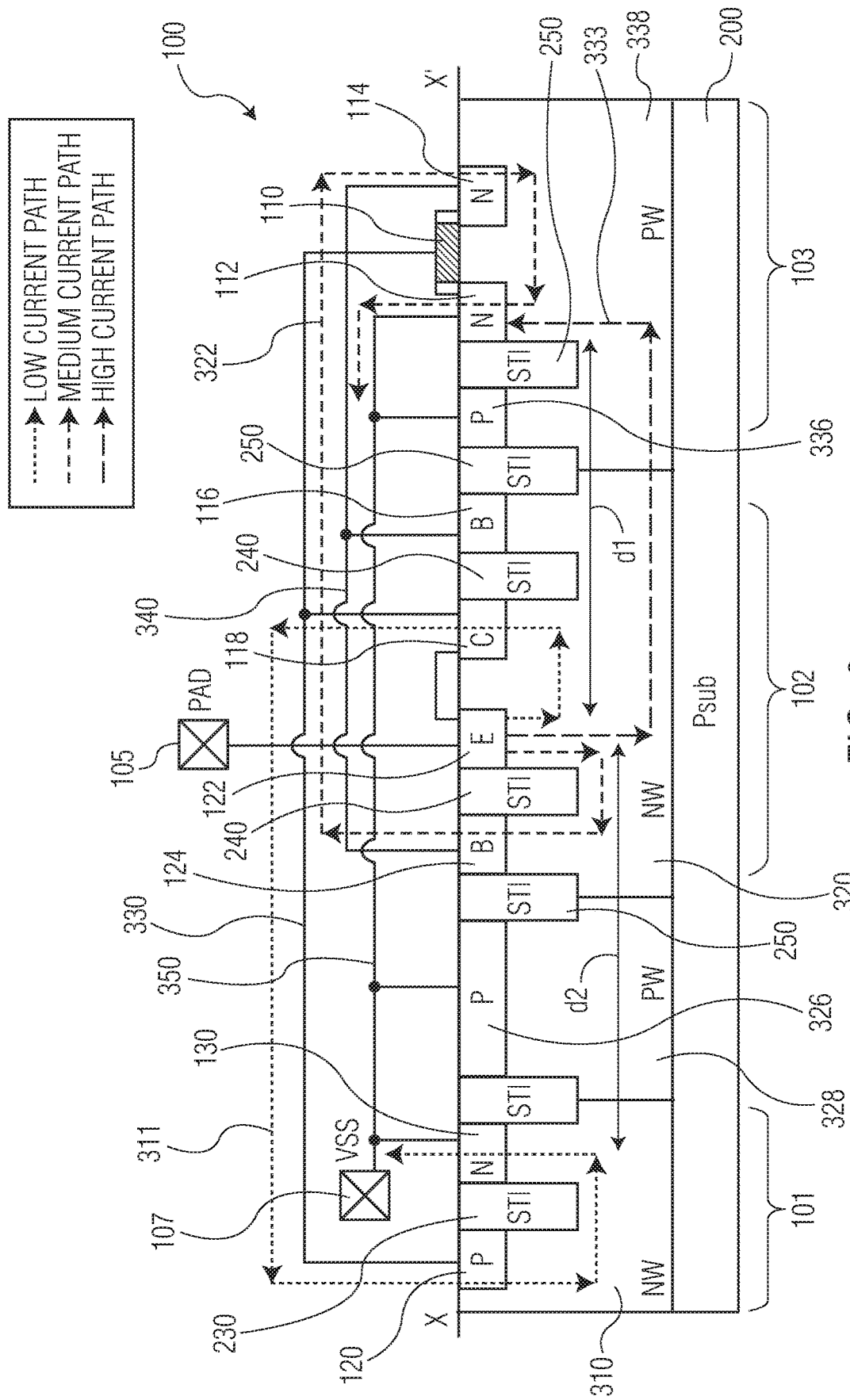
FIG. 3 illustrates a cross-sectional view along the lines X-X' of the layout structure of the ESD protection device in accordance with FIG. 2.

FIG. 1 illustrates a circuit diagram of an ESD protection device 100 in accordance with embodiments described herein. FIG. 2 illustrates a layout design of an ESD protection device 100 in accordance with FIG. 1. FIG. 3 illustrates a cross-sectional view along the lines X-X' of the layout structure of the ESD protection device 100 in accordance with FIG. 2

As illustrated in FIGS. 1-3, the ESD protection device 100 includes a diode 101, a PNP transistor 102, and an NMOS transistor 103. In normal operation, the ESD protection device 100 is in an off state. The ESD protection device 100 may be configured to handle ESD pulses that originate from a human body, called human body model (HBM) or manufacturing discharges known as charged device model (CDM).

An ESD current pulse may be received at a pad 105. The ESD protection device 100 described herein is configured to handle and channel different current levels of the ESD current pulse. The diode 101 in combination with the PNP transistor 102 may be configured to handle a low current path of the ESD current pulse. The PNP transistor 102 in combination with the diode 101 and NMOS transistor 103 may be configured to handle a medium current path of the ESD current pulse. The PNP transistor 102 in combination with the NMOS transistor 103 may form an embedded silicon controlled rectifier (SCR) device that is configured to handle a high current path of the ESD current pulse.

Regarding the structure of the device, as illustrated in FIG. 1, the diode 101 has an anode terminal 120 connected to a collector region 118 of the PNP transistor 102 and a gate of the NMOS transistor 103. A cathode terminal 130 is connected to a reference node VSS 107. FIG. 2 illustrates the diode 101 disposed along one edge of a semiconductor substrate 200. The semiconductor substrate 200 may be of a first conductivity P type. The diode 101 may be disposed in a first well 310 (illustrated in FIG. 3) of the second conductivity N type. The diode 101 may include a highly doped anode terminal 120 of the first conductivity P type and a highly doped cathode terminal 130 of the second conductivity N type. The highly doped anode terminal 120 and the highly doped cathode terminal 130 may be separated by a shallow trench isolation (STI) region 230. FIG. 3 illustrates the diode 101 disposed along the one edge of the semiconductor substrate 200. The anode terminal 120 may be connected by a first wire 330 to the collector region 118 of the PNP transistor 102 and to the gate electrode 110 of the NMOS transistor 103.

During an ESD event, a low current component of an ESD pulse may enter through the pad 105 to a highly doped emitter region 122 of the first conductivity type, through a second well 320 of a second conductivity type acting as a base, to the collector region 118 that is also highly doped of a first conductivity type. The collector region 118 sends the low current component through the first wire 330 to the anode terminal 120 of the diode 101, and the low current is routed to the reference node VSS 107 through the cathode terminal 130 to complete the low current path.

Figure 4C:
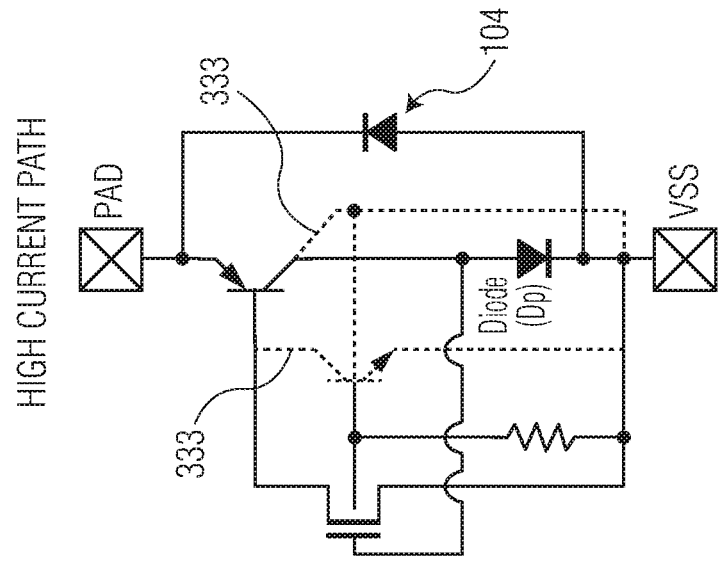
FIG. 4C illustrates a third operation mechanism for the ESD protection device during positive ESD stress from the PAD to the VSS pin in accordance with embodiments described herein.
Figure 4B:
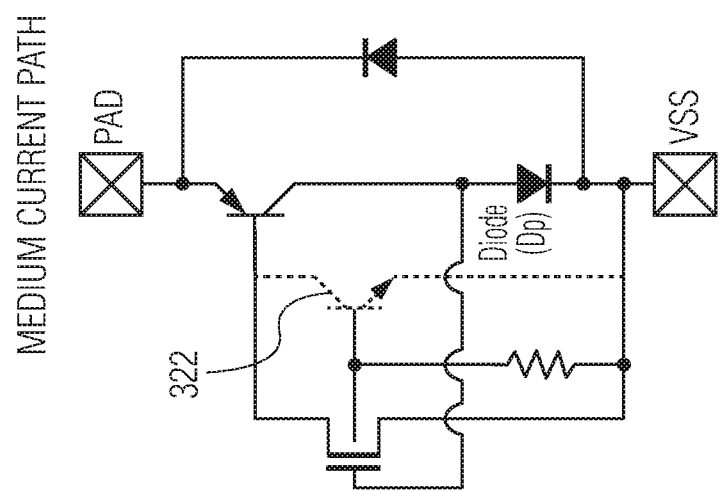
FIG. 4B illustrates a second operation mechanism for the ESD protection device during positive ESD stress from the PAD to the VSS pin in accordance with embodiments described herein.
Figure 4A:
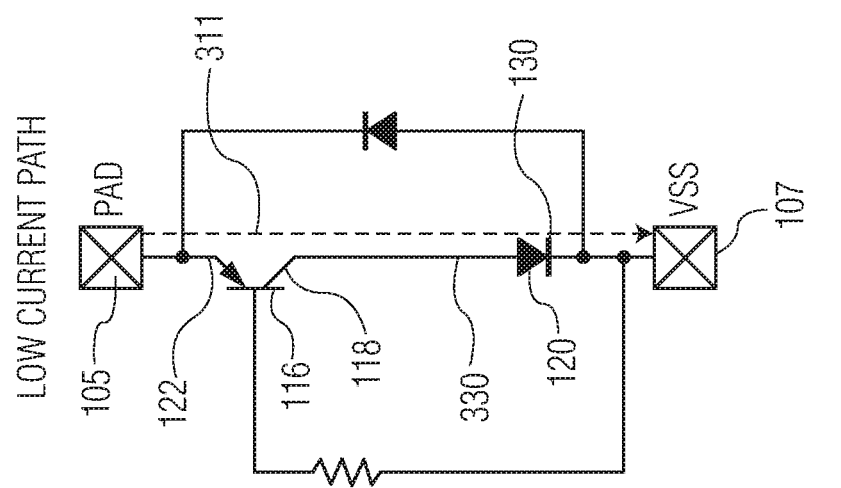
FIG. 4A illustrates a first operation mechanism for the ESD protection device during positive ESD stress from the PAD to the VSS pin in accordance with embodiments described herein.

FIG. 4A illustrates a first operation mechanism for the ESD protection device 100 during positive ESD stress from the PAD 105 to the VSS pin 107. Before triggering of the PNP transistor 102 in series with the diode 101, the NMOS transistor 103 may remain in an off-state and behave like a large resistance. Thus, the base well 320 and the base contact region 116 (illustrated in FIG. 3) of the PNP transistor 102 may be treated as floating. As a result, for a low current path a trigger mechanism of the ESD protection device 100 may be determined by a floating-base PNP transistor 102 (FBPNP) in series with the diode 101, as indicated in FIG. 3 with small dashes, and in FIG. 4A which illustrates the low current path 311.

Regarding the PNP transistor 102, referring to FIG. 1, the emitter region 122 of the PNP transistor 102 is connected to the pad 105. A base contact region 116 of the PNP transistor 102 is connected to a drain region 114 of the NMOS transistor 103. The collector region 118 of the PNP transistor 102 is connected to the anode terminal 120 of the diode 101 and to the gate electrode 110 of the NMOS transistor 103.

As illustrated in FIG. 2, the plurality of PNP transistors 202 may be disposed in a middle section of the semiconductor substrate 200. The plurality of PNP transistors 202 may include a parallel configuration of emitter regions 122 and collector contact regions 118 separated by different segments of an N well 220. The configuration of emitter regions 122 and collector contact regions 118 may be bordered on four sides by an STI region 240. The STI region 240 may be further bordered by a high dopant concentration base contact region 116. The configuration of emitter contact regions 122, collector contact regions 118, and STI 240 regions may dwell within a base well 320 of the second conductivity N type. High dopant concentration base contact regions 116 and 124 may be bordered STI regions 240 and 250.

As illustrated in FIG. 3, the string of emitter regions 122 and collector regions 118 are disposed within the second well 320 of the second conductivity type, which is disposed atop the semiconductor substrate 200 of the first conductivity type. The PNP transistor 102 may be separated from the diode 101 by a first highly doped isolation region 326 of the first conductivity P type and a first well 328 of the first conductivity P type. On the other side, the PNP transistor 102 may be separated from the NMOS transistor 103 by a second highly doped isolation region 336 of the first conductivity P type and a second well 338 of the second conductivity P type. The first highly doped isolation region 326 may have a wider width than the second highly doped isolation region 336.

The PNP transistor 102 funnels a medium current of a received ESD current pulse into a medium current path 322, illustrated by the medium dotted lines 332 in FIG. 3. In conjunction with the low current path routed by the diode 101 and PNP 102, a medium strength energy of the current pulse penetrates deep into the N well 320 below the STI regions and is attracted to an adjacent highly doped P base contact region 124. A second wire 340 connects the base contact region 124 and the drain 114 of the NMOS transistor 103. ESD current in the NMOS transistor 103 flows from drain 114 to the source 112 and then to the reference node VSS through a third wire 350. The reference node 107 VSS may provide a biasing potential for isolation P regions 326/328 and 336/338.

FIG. 4B illustrates a second operation mechanism for the ESD protection device 100 during positive ESD stress from the PAD 105 to the VSS pin 107. For the medium current path, after the FBPNP transistor 102 conducts ESD current, the gate voltage of the NMOS transistor 103 is higher than VSS 107 by at least the voltage drop across the diode 101. Therefore, ESD current is conducted by the channel of the NMOS 103 and a parasitic NPN of the gate-lifted NMOS 103, as indicated in FIG. 3 with medium dashed arrows 322 and in the "medium current path" 322 part of FIG. 4B. A parasitic NPN transistor may extend into the P well region 338, from drain 114 to source 112.

Regarding the NMOS transistor 103, FIG. 2 illustrates a plurality of drain-connected NMOS devices 203a on one side of the PNP transistor region 202 and a second plurality of NMOS devices 203b on a second side of the PNP transistor region 202. The cross-section along X' of FIG. 2 illustrates a cross section of a single NMOS transistor 103.

The NMOS transistors 103 funnel a high current of a received ESD current pulse into a high current path 333, illustrated by the long-dotted lines 333 in FIG. 3. Routing of the high current path 333 in the ESD protection device 100 includes the workings of an embedded PNPN silicon controlled rectifier (SCR) device. A high energy component of the ESD current pulse enters the P doped emitter contact region 122 and is driven farther into the N well 320 that the low and medium components. The high energy component flows to substantially a bottom of the medium doped N well 320. The high current path 333 flows into a medium doped P well 338, and out of the highly doped N source region 112. From the source, discharge current may be routed through the wire 350 to the reference potential VSS 107.

FIG. 4C illustrates a third operation mechanism for the ESD protection device 100 during positive ESD stress from the PAD 105 to the VSS pin 107. For the high current path, once the currents are high enough to trigger parasitic transistors PNP (regions 122, 320, 338) and NPN (regions 320, 338, 112), the embedded SCR discussed above comes into action and shunts the rest of the ESD current, as indicated in FIG. 3 with long dashed arrows 333 and in the "high current path" 333 part of FIG. 4C.

Embodiments described above may be used for positive stress from the PAD 105 to VSS 107. For negative ESD current pulses, a dedicated external diode 104 may be used to enhance ESD performance for negative stress from the PAD 105 to the reference node VSS 107.

The diode 101, lateral PNP transistor 102, and NMOS transistor 103 may be silicided or unsilicided depending on conductivity preferences of a designer. Total widths of the PNP transistor 102, NMOS transistor 103, and diode 101 may be 1000 µm, 200 µm, and 46 µm, respectively. A finger width of both the PNP transistor 102 and the NMOS transistor 103 may be 50 µm.

As illustrated in FIG. 3, to avoid SCR action between the PNP transistor 102 and the diode 101, the wide highly doped P region 326 may have about a 10-µm length. To boost the high current path ESD current capability by triggering the embedded SCR between the PNP transistor 102 and the GGNMOS 103 in the high-current regime, a distance d1 may be about 7.5 µm, including an intentionally narrow highly doped P region 336.

An alternative to using the PNP 102 would be to use a PMOS device. As illustrated in FIG. 3, the highly doped P emitter 122 and collector 118 regions could be used as P doped source and drain regions. A gate 360 could be used to create a conduction channel. Instead of the emitter 122 connected to the PAD 105, the gate 360 would be connected to the PAD 105 to receive the ESD pulse.

Figure 5:
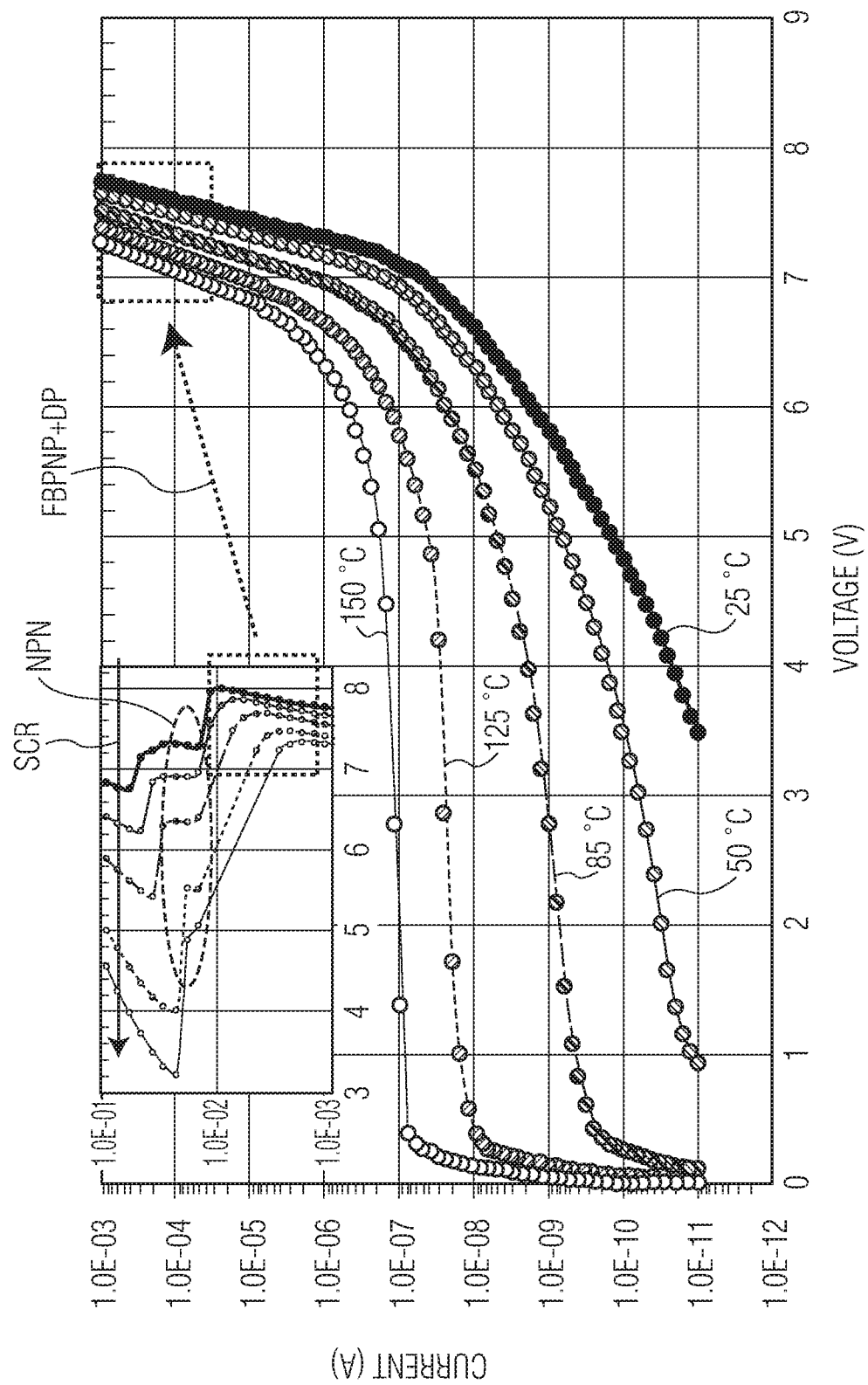
FIG. 5 illustrates DC current-voltage characteristics over temperature for the ESD protection device in accordance with embodiments described herein.

FIG. 5 illustrates DC current-voltage characteristics over temperature for the ESD protection device 100. The breakdown voltage is higher than 5 V at all temperatures, and the sub-5-V leakage current is less than 1 µA, which is a typical product requirement.

Figure 6:
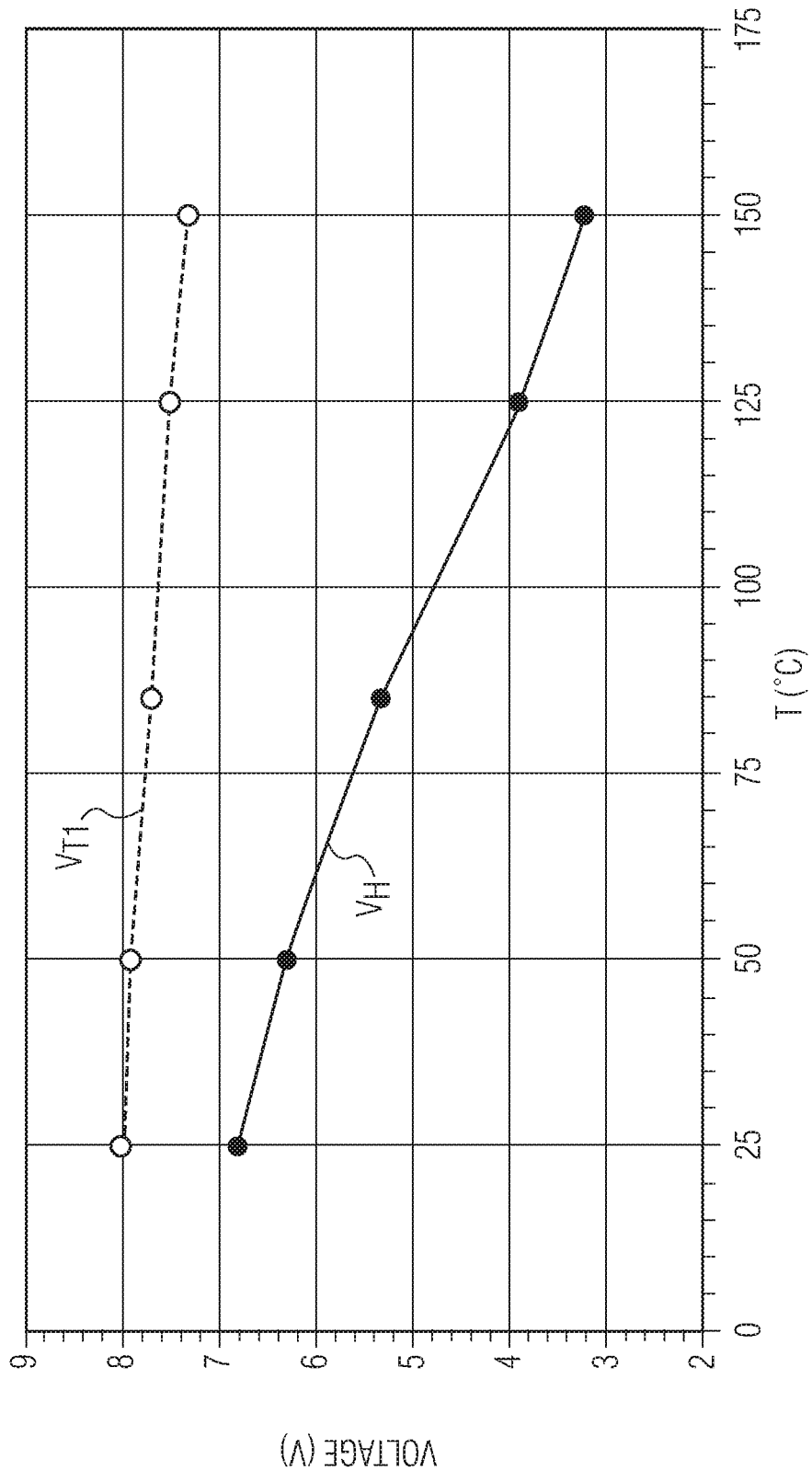
FIG. 6 illustrates the DC holding voltage (VH) and trigger voltage (VT1) as a function of temperature for the ESD protection device in accordance with embodiments described herein.

FIG. 6 illustrates the DC holding voltage (VH) and trigger voltage (VT1) as a function of temperature for the ESD protection device 100. VH may be captured at a lowest voltage point in a zoomed-in view, as illustrated in FIG. 5. For good noise or transient-event immunity, VT1 may be higher than 5 V. The ESD protection device 100 illustrates a VT1 of 7.2 V at 150° C., which represents a 40% margin. A requirement for VH is that it should be higher than 5 V for decent latch-up immunity after the device has been triggered. It is thus clear that the ESD protection device 100 may safely be used for most mobile applications at 85° C.

Figure 7:
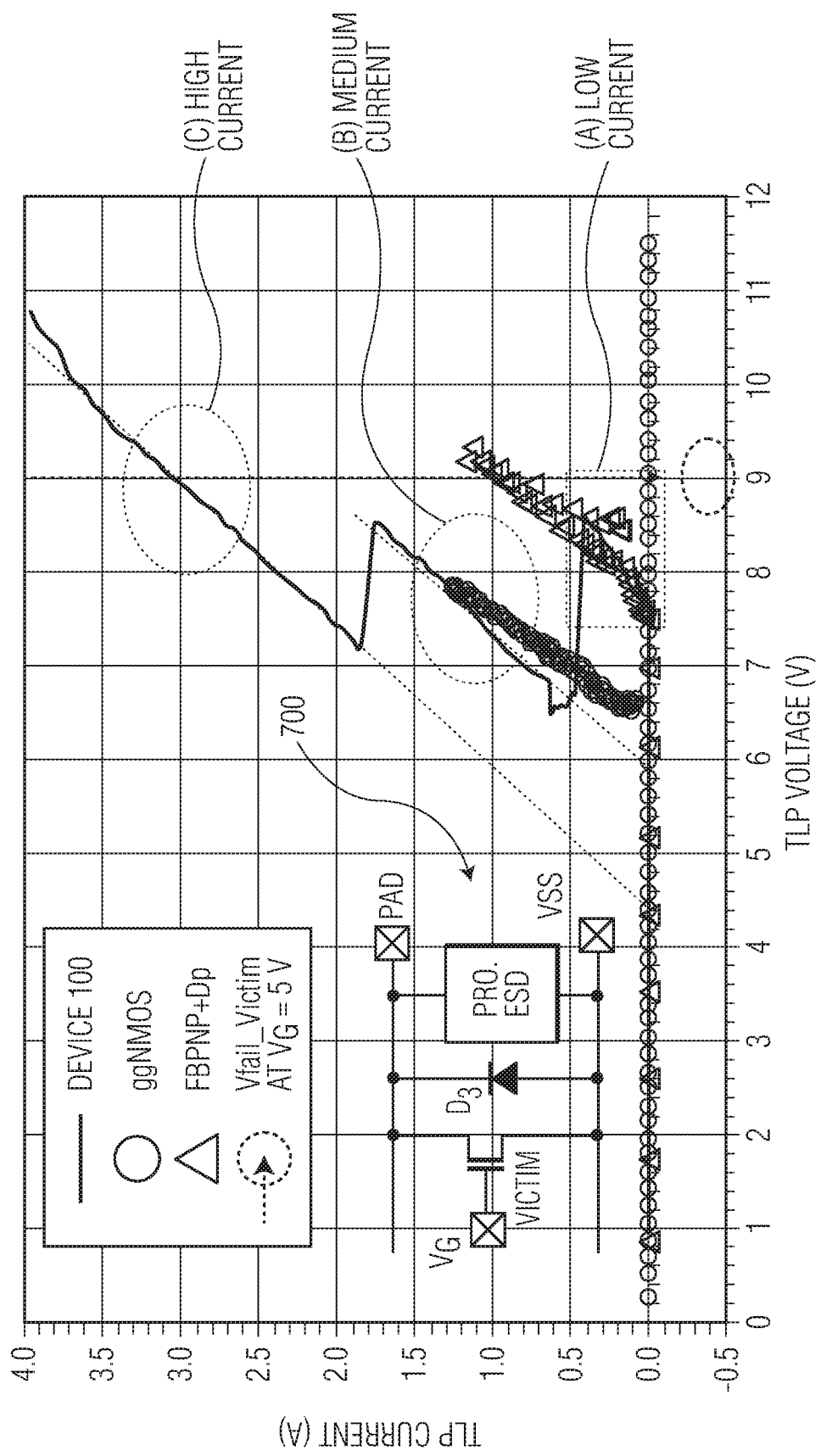
FIG. 7 illustrates a test structure for an ESD devices in parallel with the device to be protected (victim) in accordance with embodiments described herein.

FIG. 7 illustrates a test structure 700 for an ESD devices in parallel with the device to be protected (victim) in accordance with embodiments described herein. Embodiments discuss transmission line pulse (TLP) current-voltage characteristics. To estimate ESD robustness, a safe operating area, and the voltage and current conditions over which the device can be expected to operate without self-damage of an NMOS victim transistor may be characterized. To increase a snapback voltage of the victim by reducing a base resistance of a parasitic lateral bipolar transistor, an additional Psub guard ring may be inserted around every two fingers of the victim. Use of the floating-base PNP 102 may be used to reduce VT1. The use of the gate-lifted NMOS 103 reduces VT1 and provides substantially uniform turn-on for multi-finger implementations. In this technology, the VT1 of the FBPNP 102 plus the diode 101 is around 7.6 V, much lower than the 9.3 V of a non-floating base PNP plus a diode. The VT1 of the parasitic NPN bipolar transistor of the NMOS 103 is around 6.5-7.0 V when the voltage at the gate 110 is 1-2 V.

FIG. 7 illustrates the TLP characteristics of the ESD protection device 100, together with those of FBPNP 102 plus diode 101 and a 200-µm-wide unsilicided GGNMOS 103. The total width of a silicided-NMOS "victim" may be 240 µm. A last point of each curve is the point just before hard failure. The ESD protection device illustrates three ESD-current-conduction regimes. In the low-current regime (up to 0.4 A), the mechanism is determined by the FBPNP 102 plus diode 101, as suggested in the "low current" TLP characteristics via their similar slopes. In the medium-current regime (0.5-1.7 A), ESD current is conducted by the parallel combination of the gate-lifted NMOS 103, FBPNP 102, and diode 101, and is greater than that of the single GGNMOS, as indicated in the "medium current" TLP characteristics. As discussed previously, the trigger voltage of the GGNMOS can be reduced if the gate node sees one diode's worth of potential drop (at least), which is consistent with the VT1 of 8.6 V (FBPNP 102 plus diode 101=~9.2 V at 1.1 A, when a diode dope=~0.6 V). Furthermore, extrapolation of the curve from the medium-current regime to 6 V on the voltage axis may indicate that the mechanism is determined by the gate-lifted NMOS 103. In the high-current regime (1.8-4.0 A), extra ESD conduction current can be attributed to embedded SCR action, because there are no individual ESD components in this scheme that could sustain such a high current IT2. Additionally, extrapolation from the high-current regime to 4.5V on the voltage axis suggests SCR action with a deep snapback voltage.

Example ESD parameters of the devices described herein are summarized in TABLE I.

TABLE I

ESD parameters of ESD devices at 25° C.

| ESD device | $I_{leak}{}^a$ (nA) | $V_{T1}$ (V) | $V_H$ (V) | $I_{T2}$ (A) |
| --- | --- | --- | --- | --- |
| ggNMOS[b] | 0.1 | 11.5 | 6.5 | 1.2 |
| PNP + Dp[c] | 0.5 | 9.3 | 8.6 | 1.0 |
| FBPNP + Dp[c] | 0.5 | 7.6 | 7.5 | 1.1 |
| ESD Protection device 100[d] | 0.1 | 7.7 | 6.7 | 4.0 |

[a]DC $I_{leak}$ is assessed at V = 5 V.
[b]Width: 240 μm.
[c]Widths: PNP = 1000 μm, Dp = 23 μm.
[d]Widths: PNP = 1000 μm, Dp = 46 μm, ggNMOS = 200 μm.

Figure 8:
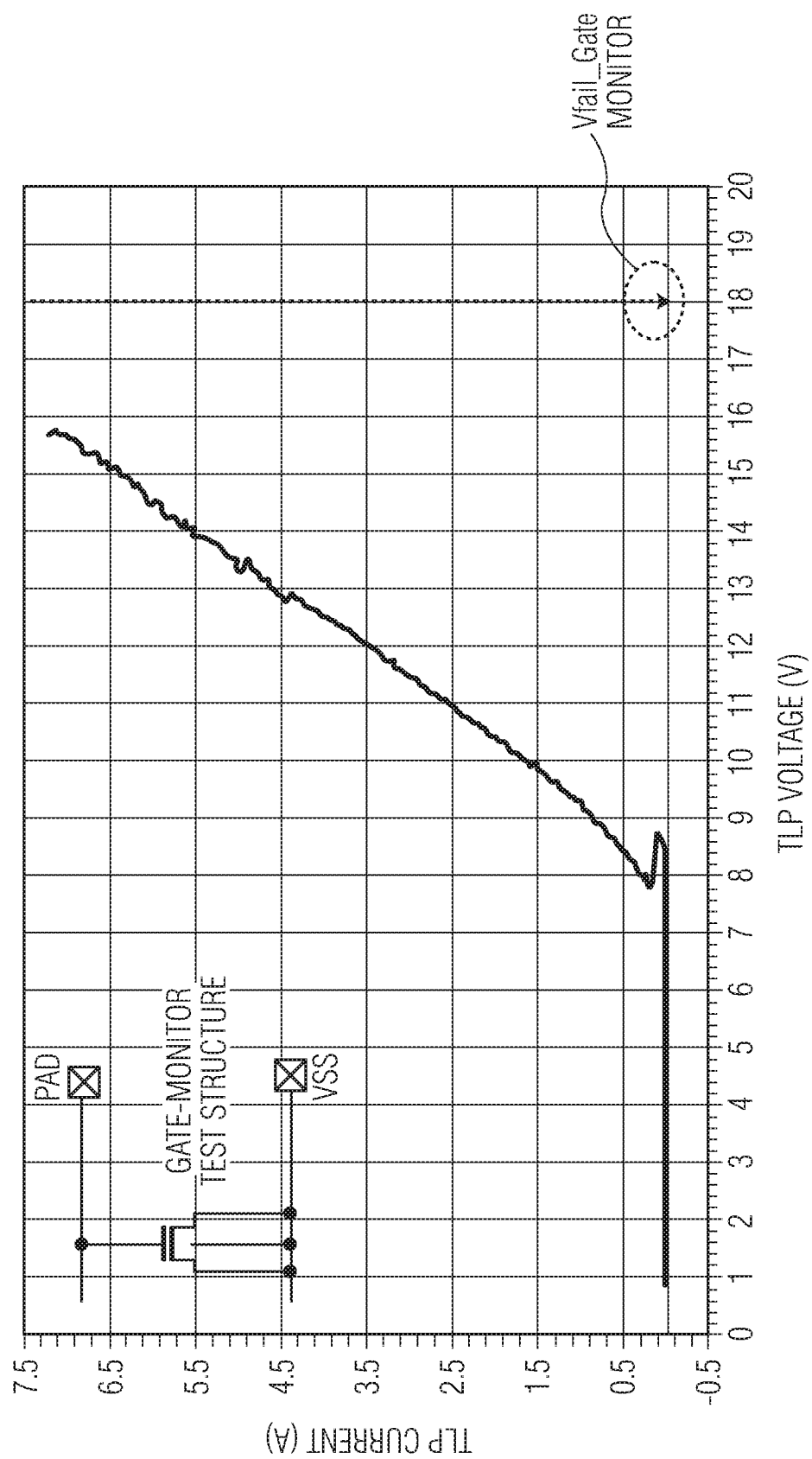
FIG. 8 illustrates the VF-TLP characteristics of the ESD protection device, together with a schematic of a standalone 5-V gate-monitor test structure in accordance with embodiments described herein.

There is the possibility of damage to the gate oxide from ESD events with very short rise times if the ESD device cannot turn on in time. FIG. 8 illustrates the VF-TLP characteristics of the ESD protection device 100, together with a schematic of a standalone 5-V gate-monitor test structure. The last point of the curve is a point just before hard failure. It can be seen that the ESD protection device 100 can trigger early enough to protect the gate oxide.

Figure 9:
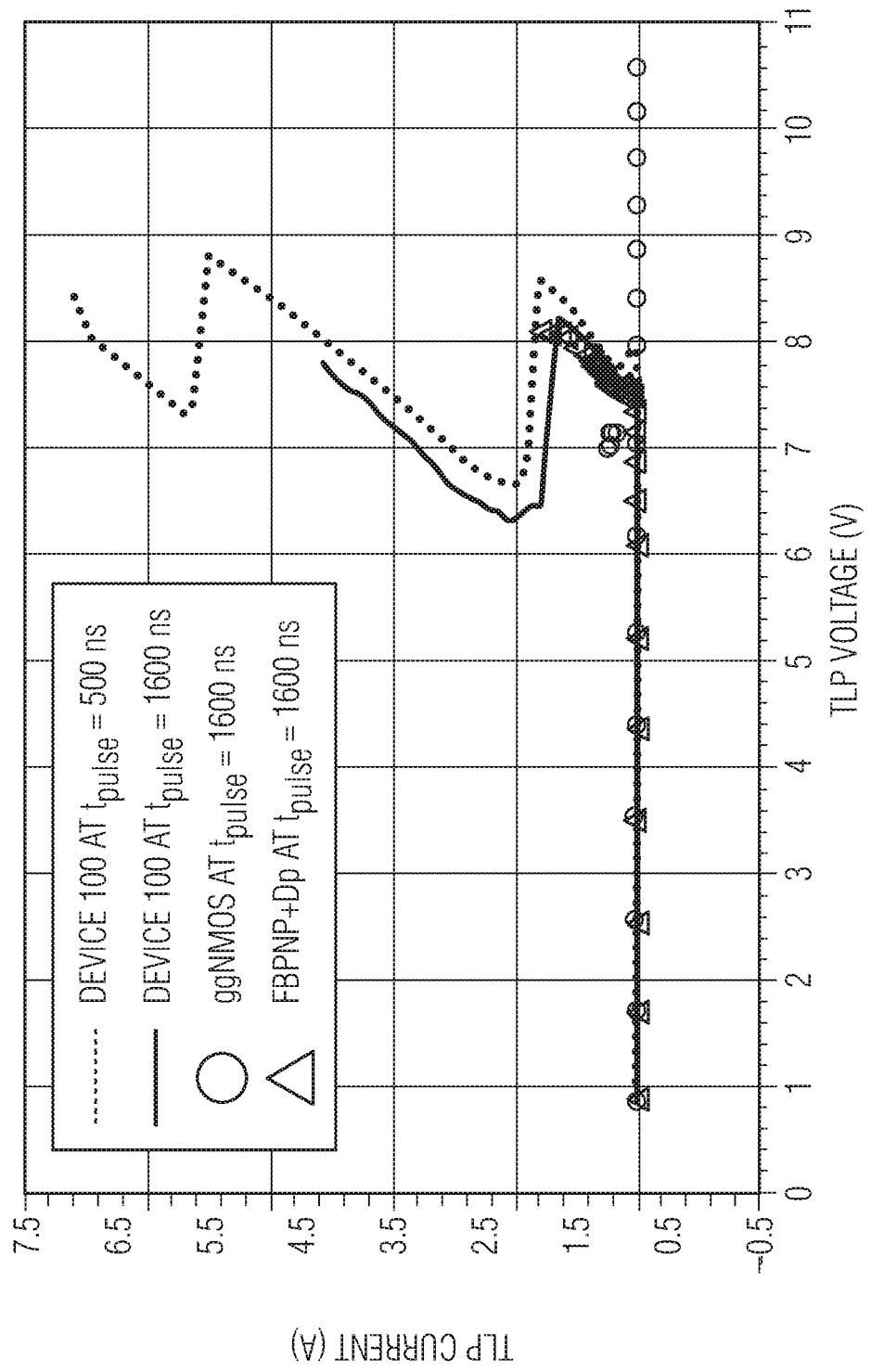
FIG. 9 illustrates TLP long-pulse characteristics of the GGNMOS, FBPNP+diode, and ESD protection device.

Because surge-robustness requirements are becoming increasingly important, it is interesting to examine the ESD protection device 100 behavior for long pulse widths. FIG. 9 illustrates TLP long-pulse characteristics of the GGNMOS, FBPNP+diode, and ESD protection device 100. The last point of each curve is the point just before hard failure. As can be seen, the ESD protection device 100 demonstrates performance superior to that of the traditional GGNMOS and FBPNP+DP ESD devices. The SCR action persists up to at least tpulse=500 ns. TABLE II illustrates the ESD mechanisms of the ESD protection device 100 with different pulse widths, under 10-ns rise-time TLP conditions.

TABLE II

ESD Mechanisms and $I_{T2}$ of the ESD protection device 100 with different pulse widths under 10-ns rise-time TLP conditions at 25° C.

| TLP | ESD current-conduction mechanisms | | | ESD current capability |
| --- | --- | --- | --- | --- |
| Pulse width (ns) | FBPNP + $D_p$ | GC-NMOS | SCR | $I_{T2}$ (A) |
| 100 | X | X | X | 4.0 |
| 500 | X | X | X | 2.3 |
| 1000 | X | X | — | 1.4 |
| 1600 | X | X | — | 1.3 |

The DC current-voltage characteristics over temperature for the ESD protection device 100 after snapback are illustrated in the insert of FIG. 5. It can be seen that the conduction of ESD current at 25° C. is dominated by the parasitic NPN transistor. Therefore, a high VH can be expected, as indicated in FIG. 6, which is consistent with the snapback voltage at medium current level seen in FIG. 7 under 25° C. TLP conditions. In addition, SCR action is absent from TABLE I for pulse widths of 1000 ns and 1600 ns, because the device cannot handle the power levels involved (I>1 A). The ESD protection device 100 may already be destroyed before reaching the current levels at which the SCR action would begin (see also the curves in FIG. 8).

FIG. 6 summarizes the DC measurements (with maximum currents of 90 mA). These DC power levels are approximately a factor of 10 lower than the TLP power levels with the longer pulse widths. The SCR action starts to dominate the ESD conduction at higher temperatures as the trigger current of the SCR decreases with increasing temperature, as seen in FIG. 5. As a result, the VH is much lower at 150° C. than at 25° C. The deeper VH (3.2 V) at 150° C. in FIG. 6 is consistent with the SCR conduction mechanism at high current levels (seen in FIG. 7 under 25° C. TLP conditions) when considering self-heating effects.

For better latch-up safety, the ESD current can be re-routed through the gate-coupled NMOS by increasing the base distance (d1) with a wider Psub tap. In addition, a higher VH could be expected by simply increasing the channel length of the NMOS transistor. Surge-robustness optimization is possible via increasing the size of the NMOS transistor, according to FIG. 6.

This combination of devices may be used to form an ESD device for specific applications such as open-drain, fail-safe, supply, and surge protections. This well-established approach can save silicon area, reduce time-to-market, and can easily be ported to different technologies.

Embodiments described herein include a gate-lifted NMOS ESD protection device triggered by a PNP in series with a diode is demonstrated for 5-V mobile applications up to 85° C. in a 0.18-μm CMOS process. The trigger mechanism may be determined by a floating-base PNP in series with a diode, while the ESD current is conducted via the channel and the parasitic parallel NPN transistor of the gate-lifted NMOS and boosted at higher current levels via embedded SCR action. This voltage-triggered technique may protect signal pins due to false-triggering issues with capacitive-triggered solutions. Furthermore, the ESD protection device 100 demonstrates long-pulse TLP characteristics superior to those of traditional GGNMOS and FBPNP+DP ESD devices, hence robust surge performance can be expected.

The gate-lifted NMOS ESD protection device triggered by a PNP in series with a diode in a 0.18-μm bulk CMOS technology for 5-V mobile applications up to 85° C. This voltage-triggering scheme is suitable for fail-safe, open-drain, supply, and surge protections. In addition, the robust ESD performance is boosted by embedded-SCR action in the high-current regime. No extra masks nor additional RC control circuitry are required for this implementation.

Although the various exemplary embodiments have been described in detail with particular reference to certain exemplary aspects thereof, it should be understood that the invention is capable of other embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

The invention claimed is:

1. An electrostatic discharge (ESD) protection device, comprising: a PNP transistor connected to an input pad; a diode having an anode terminal directly connected to a collector of the PNP transistor and a cathode terminal directly connected to an output pad; and an NMOS transistor directly connected to a floating base region of the PNP transistor and the output pad, wherein the diode, the PNP transistor, and the NMOS transistor are configured to route different levels of an electrostatic discharge (ESD) current from the input pad to the output pad, wherein the PNP transistor and the NMOS transistor combine to form a medium current path for the ESD current.

2. The ESD protection device of claim 1, wherein the ESD protection device is triggered by the PNP transistor in series with the diode.

3. The ESD protection device of claim 2, wherein a trigger mechanism of the ESD protection device is the floating base region of the PNP transistor in series with the diode.

4. The ESD protection device of claim 3, wherein the NMOS transistor is in an initial off state because of the floating base region of the PNP transistor.

5. The ESD protection device of claim 1, wherein the diode and the PNP transistor combine to form a low current path for the ESD current.

6. The ESD protection device of claim 1, wherein the NMOS transistor and the PNP transistor combine to form an embedded SCR configured to route a high current path for the ESD current.

7. The ESD protection device of claim 1, wherein a gate of the NMOS transistor is directly connected to the collector of the PNP transistor and to the anode terminal of the diode.

8. The ESD protection device of claim 1, wherein an emitter of the PNP transistor is connected to the input pad.

9. The ESD protection device of claim 1, wherein the ESD current is conducted via a channel of the NMOS transistor and a parasitic parallel NPN transistor and boosted at higher current levels via embedded SCR action.

10. The ESD protection device of claim 1, further comprising:
a first isolation region disposed between the diode and the PNP transistor; and
a second isolation region disposed between the PNP transistor and the NMOS transistor.

11. The ESD protection device of claim 10, wherein the first isolation region is wider than the second isolation region.

12. The ESD protection device of claim 10, wherein the PNP transistor has emitter and collector contact regions having a same conductivity type as the first isolation region and the second isolation region.

13. A method of operating an electrostatic discharge (ESD) protection device, comprising:
receiving a low energy current portion of an ESD pulse at an PNP transistor;
conducting the low energy current portion of the ESD pulse to an output pad through a diode having an anode terminal directly connected to a collector of the PNP transistor and a cathode terminal directly connected to the output pad;
receiving a medium energy current portion of the ESD pulse at the PNP transistor;
conducting the medium energy current portion of the ESD pulse to the output pad through an NMOS transistor directly connected to a floating base region of the PNP transistor;
receiving a high energy current portion of the ESD pulse at the PNP transistor and
conducting the high energy current portion of the ESD pulse to the output pad through a silicon controlled rectifier (SCR) formed from the PNP transistor and the NMOS transistor.

14. The method of claim 13, further comprising:
triggering the ESD protection device using the PNP transistor in series with the diode.

15. The ESD protection device of claim 14, wherein a trigger mechanism of the ESD protection device is the floating base region of the PNP transistor in series with the diode.

16. The ESD protection device of claim 15, wherein the NMOS transistor is in an initial off state because of the floating base region of the PNP transistor.

17. The ESD protection device of claim 13, wherein a gate of the NMOS transistor is directly connected to the collector of the PNP transistor and to the anode terminal of the diode.

18. The ESD protection device of claim 13, wherein an emitter of the PNP transistor is connected to the input pad.

19. The ESD protection device of claim 13, wherein the ESD current is conducted via a channel of the NMOS transistor and a parasitic parallel NPN transistor and boosted at higher current levels via embedded SCR action.

* * * * *